(12) United States Patent
Hou

(10) Patent No.: US 10,811,476 B2
(45) Date of Patent: Oct. 20, 2020

(54) PIXEL DEFINITION LAYER, MANUFACTURING METHOD THEREOF, DISPLAY SUBSTRATE AND DISPLAY DEVICE

(71) Applicant: BOE Technology Group Co., Ltd., Beijing (CN)

(72) Inventor: Wenjun Hou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/165,050

(22) Filed: Oct. 19, 2018

(65) Prior Publication Data
US 2019/0305059 A1    Oct. 3, 2019

(30) Foreign Application Priority Data
Mar. 28, 2018    (CN) ............... 2018 1 0263632

(51) Int. Cl.
*H01L 27/32* (2006.01)
*H01L 51/00* (2006.01)
*H01L 27/15* (2006.01)

(52) U.S. Cl.
CPC ...... *H01L 27/3246* (2013.01); *H01L 27/3216* (2013.01); *H01L 51/0014* (2013.01); *H01L 27/156* (2013.01); *H01L 51/0012* (2013.01)

(58) Field of Classification Search
CPC ........... H01L 27/3246; H01L 27/3216; H01L 51/0014; H01L 51/0004; H01L 2251/558; H01L 51/56; H01L 51/0012; H01L 27/156
See application file for complete search history.

(56) References Cited

U.S. PATENT DOCUMENTS

| | | | |
|---|---|---|---|
| 2005/0057152 A1 | 3/2005 | Park | |
| 2006/0188661 A1* | 8/2006 | Hirai | H01L 51/0005 427/533 |
| 2007/0264590 A1* | 11/2007 | Fukuchi | B82Y 10/00 430/139 |
| 2007/0269621 A1 | 11/2007 | Mitsuhashi et al. | |
| 2014/0110701 A1 | 4/2014 | Noh | |

(Continued)

FOREIGN PATENT DOCUMENTS

| | | |
|---|---|---|
| CN | 101076211 A | 11/2007 |
| CN | 103779380 A | 5/2014 |

(Continued)

*Primary Examiner* — Patricia D Reddington
(74) *Attorney, Agent, or Firm* — Fay Sharpe LLP

(57) ABSTRACT

A pixel definition layer, a manufacturing method thereof, a display substrate and a display device are provided. The pixel definition layer includes: a lyophilic material layer on a base substrate, and a lyophobic material layer on the side, away from the base substrate, of the lyophilic material layer. The pixel definition layer defines a plurality of pixel regions, in an arrangement of array, on the base substrate, each pixel region comprises at least two sub-pixel regions, and the lyophilic material layers that define the different sub-pixel regions in the same pixel region have different thicknesses. With the pixel definition layer, the climbing quantities of the different solutions in the corresponding pixel definition layers are the same as much as possible. The film-forming uniformity of the solutions in the pixel region is effectively improved.

20 Claims, 11 Drawing Sheets

(56) References Cited

U.S. PATENT DOCUMENTS

| | | | |
|---|---|---|---|
| 2016/0284776 A1* | 9/2016 | Kim | .................... H01L 27/3258 |
| 2018/0108839 A1 | 4/2018 | Hao et al. | |
| 2019/0006612 A1* | 1/2019 | Zhang | ................ H01L 51/5284 |
| 2019/0096970 A1 | 3/2019 | Hou | |
| 2019/0115402 A1 | 4/2019 | Wang et al. | |

FOREIGN PATENT DOCUMENTS

| | | |
|---|---|---|
| CN | 105895818 A | 8/2016 |
| CN | 106024827 A | 10/2016 |
| CN | 106206983 A | 12/2016 |
| CN | 106941112 A | 7/2017 |
| CN | 107527939 A | 12/2017 |
| CN | 107591432 A | 1/2018 |
| CN | 107689390 A | 2/2018 |
| EP | 3671845 A1 | 6/2020 |
| JP | 2009140689 A | 6/2009 |

\* cited by examiner

US 10,811,476 B2

PIXEL DEFINITION LAYER, MANUFACTURING METHOD THEREOF, DISPLAY SUBSTRATE AND DISPLAY DEVICE

This application claims priority to Chinese Patent Application No. 201810263632.5, filed on Mar. 28, 2018 and titled "PIXEL DEFINITION LAYER, MANUFACTURING METHOD THEREOF, DISPLAY SUBSTRATE AND DISPLAY DEVICE", the disclosure of which are incorporated herein by reference in its entirety.

TECHNICAL FIELD

The present disclosure relates to a pixel definition layer, a manufacturing method thereof, a display substrate and a display device.

BACKGROUND

An OLED (Organic Light-Emitting Diode) display panel includes an anode, a hole injection layer, a hole transport layer, an organic material film layer, an electron transport layer, an electron injection layer, a cathode and the like. The organic material film layer may be manufactured by an ink-jet printing technology. When the organic material film layer is manufactured by using the ink-jet printing technology, a pixel definition layer needs to be formed on a base substrate first. Then, the solution in which an organic luminescent material is dissolved is sprayed onto the base substrate with the pixel definition layer formed thereon to form the organic material film layer. The pixel definition layer is adopted to define a plurality of pixel regions on the base substrate.

SUMMARY

The present disclosure provides in some embodiments a pixel definition layer, a manufacturing method thereof, a display substrate and a display device.

In an aspect, there is provided a pixel definition layer, comprising:

a lyophilic material layer disposed on a base substrate, and a lyophobic material layer disposed on the side, away from the base substrate, of the lyophilic material layer, wherein the pixel definition layer defines a plurality of pixel regions, in an arrangement of array, on the base substrate, each pixel region comprises at least two sub-pixel regions, and the lyophilic material layers that define the different sub-pixel regions in the same pixel region have different thicknesses.

Optionally, the thicknesses of the lyophilic material layers that define the different sub-pixel regions in the same pixel region are positively correlated with areas of the sides, close to the base substrate, of the sub-pixel regions that are defined by the corresponding lyophilic material layers.

Optionally, the sub-pixel regions in the same pixel region comprise a first sub-pixel region, a second sub-pixel region and a third sub-pixel region, each sub-pixel region is used to set sub-pixels in one color, and the lyophilic material layers that define the sub-pixel regions in which the sub-pixels with different colors are disposed have different thicknesses.

Optionally, the thickness of the lyophilic material layer that defines the first sub-pixel region, the thickness of the lyophilic material layer that defines the second sub-pixel region, and the thickness of the lyophilic material layer that defines the third sub-pixel region are sequentially increased.

Optionally, the first sub-pixel region is adapted to a red sub-pixel, the second sub-pixel is adapted to a green sub-pixel, and the third sub-pixel is adapted to a blue sub-pixel.

Optionally, the lyophilic material layer comprises at least two lyophilic sub-layers that are disposed at the same layer and in the same pixel region, in the same pixel region, each lyophilic sub-layer corresponds to one sub-pixel region, and the at least two lyophilic sub-layers are different in thickness.

Optionally, the lyophilic material layer comprises at least two lyophilic sub-layers and is formed by superimposing the at least two lyophilic sub-layers, and the layer numbers of lyophilic sub-layers contained in the lyophilic material layer are different for the different sub-pixel regions in the same pixel region.

Optionally, an orthographic projection of the surface, away from the base substrate, of the lyophilic material layer on the base substrate is within an orthographic projection of the surface close to the base substrate of the lyophilic material layer on the base substrate.

Optionally, an orthographic projection of the surface, away from the base substrate, of the lyophobic material layer on the base substrate is within an orthographic projection of the surface, close to the base substrate, of the lyophobic material layer on the base substrate.

Optionally, an area of an orthographic projection of the surface, close to the base substrate, of the lyophobic material layer on the base substrate is equal to an area of an orthographic projection of the surface, away from the base substrate, of the lyophilic material layer on the base substrate.

Optionally, for the lyophilic sub-layers in each sub-pixel region, cross sections of the lyophilic sub-layers in a target direction are trapezoidal, and the target direction is perpendicular to the base substrate and parallel to an edge of the sub-pixel region.

Optionally, a cross section of the sub-pixel region in a direction that is parallel to the base substrate is rectangular.

Optionally, the pixel definition layer has different thicknesses in different positions.

Optionally, the lyophilic material layer has a total thickness of 0.05-0.5 micrometer, and the lyophobic material layer has a total thickness of 0.2-2 micrometers.

Optionally, the lyophilic material layer is made from a lyophilic material that contains silicon dioxide or silicon nitride; and the lyophobic material layer is made from a lyophobic material that contains fluorinated polyimide, fluorinated polymethyl methacrylate or polysiloxane.

In another aspect, there is provided a manufacturing method of a pixel definition layer, comprising:

forming a lyophilic material film layer on a base substrate by a lyophilic material;

processing the lyophilic material film layer to obtain a lyophilic material layer; the lyophilic material layer defining a plurality of pixel regions, in an arrangement of array, on the base substrate, each pixel region comprising at least two sub-pixel regions, and the lyophilic material layers that define the different sub-pixel regions in the same pixel region having different thicknesses; and forming a lyophobic material layer on the side, away from the base substrate, of the lyophilic material layer by a lyophobic material, wherein Optionally, said processing the lyophilic material film layer to obtain the lyophilic material layer comprises:

performing pattern processing on the lyophilic material film layer by means of a preset mask.

In yet another aspect, there is provided a display base substrate, comprising a base substrate, a pixel definition layer on the base substrate, and a luminescent layer in a pixel region that is defined by the pixel definition layer, wherein the pixel definition layer comprises:

a lyophilic material layer on the base substrate and a lyophobic material layer on the side away from the base substrate of the lyophilic material layer; and the pixel definition layer defines a plurality of pixel regions, in an arrangement of array, on the base substrate, each pixel region comprises at least two sub-pixel regions, and the lyophilic material layers that define the different sub-pixel regions in the same pixel region have different thicknesses.

Optionally, the display substrate further comprises:

an anode disposed between the base substrate and the pixel definition layer, and a cathode disposed on the side away from the base substrate of the luminescent layer.

In still yet another aspect, there is provided a display device, comprising the display substrate described above.

DETAILED DESCRIPTION

The present disclosure will be described in further detail with reference to the enclosed drawings, to clearly present the principles and advantages of the present disclosure.

Compared with a liquid crystal display, an OLED display has the advantages of self-illumination, quick response, wide view angle, high brightness, beautiful color, thinness and the like. Methods for manufacturing a film layer in an organic electroluminescent device mainly include vacuum evaporation and solution processes. Vacuum evaporation is suitable for film forming of an organic small-molecule material, has the advantages of excellent film-forming uniformity and relatively more mature technology, however, is high in film-forming equipment investment, low in material utilization ratio and low in alignment precision when used for a large-sized product. The solution process includes spin-coating, ink-jet printing, nozzle coating and the like, is suitable for film forming of a polymer material and soluble small molecules, has the advantage of low equipment cost, and has an outstanding advantage in large-scale and large-sized production. This outstanding advantage is particularly obvious in the ink-jet printing technology. The ink-jet printing technology needs to form a pixel definition layer on a base substrate with an anode in advance. The pixel definition layer defines a plurality of pixel regions, disposed in an array, on the base substrate. Each pixel region is configured to dispose a sub-pixel. The pixel definition layer may produce a certain acting force on an ink-jet printing solution. This acting force enables the solution to accurately flow into an appointed R (red)/G (green)/B (blue) sub-pixel region through limitation. However, as the pixel regions on the base substrate are different in size, when the pixel definition layer is formed by the same film-forming process by means of the same ink, the ink has different climbing quantities on the pixel definition layer, which affects the film-forming uniformity of the solution in the pixel region.

Figure 1:
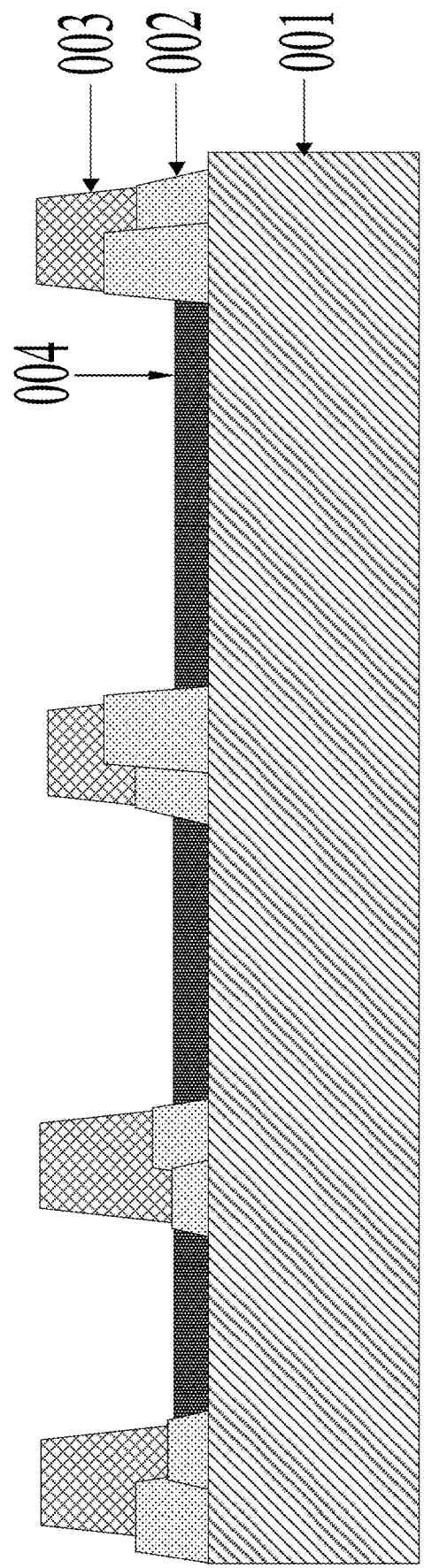
FIG. 1 is a schematic diagram of a structure of a pixel definition layer according to an embodiment of the present disclosure.

FIG. 1 is a schematic diagram of a structure of a pixel definition layer provided by an embodiment of the present disclosure. As shown in FIG. 1, the pixel definition layer may include:

a lyophilic material layer 002 disposed on a base substrate 001, and a lyophobic material layer 003 disposed on the side, away from the base substrate 001, of the lyophilic material layer 002. Usually, an anode 004 may be further disposed between the base substrate 001 and the lyophilic material layer 002.

The pixel definition layer may define a plurality of pixel regions, in an arrangement of array, on the base substrate 001. Each pixel region includes at least two sub-pixel regions. The lyophilic material layers 002 that define the different sub-pixel regions in the same pixel region have different thicknesses. Since when an ink-jet printing method is adopted to manufacture the film layer in the organic electroluminescent device, under the same film-forming process, solutions for preparing the film layers in the different sub-pixel regions are the same in viscosity, surface tension and flow characteristic in the sub-pixel regions, when the corresponding solutions are sprayed into the different sub-pixel regions simultaneously, under the conditions of the same film-forming process and the same film-forming time, the lyophilic material layers 002 with the different thicknesses may produce different acting forces onto corresponding solution molecules. These different acting forces are manifested in that the relatively thicker lyophilic material layer 002 produces a relatively greater attraction to the solution molecules, such that the solution molecules climb at a relatively higher speed in the sub-pixel regions under the action of the attraction, and the relatively thinner lyophilic material layer 002 produces a relatively smaller attraction to the solution molecules, such that the solution molecules climb at a relatively lower speed in the sub-pixel regions under the action of the attraction. At last, the climbing quantities of the solutions for forming the sub-pixels with different areas in the corresponding sub-pixel regions are the same as much as possible. Thus, the film-forming uniformity in the pixel region is improved.

The lyophilic material layer 002 is made from a lyophilic material. The lyophilic material is a material that is attractive to a solution in which an organic electroluminescent material is dissolved. The lyophobic material layer 003 is made from a lyophobic material. The lyophobic material is a material that is repellent to the solution in which the organic electroluminescent material is dissolved. Exemplarily, the lyophobic material may be any one of fluorinated polyimide, fluorinated polymethyl methacrylate and polysiloxane. The lyophilic material may be silicon dioxide or silicon nitride.

To sum up, the pixel definition layer provided by the embodiment of the present disclosure includes the lyophilic material layer and the lyophobic material layer. The lyophilic material layers that define the different sub-pixel regions in the same pixel region have different thicknesses, such that in a process of manufacturing an organic luminescent layer, the lyophilic material layers with different thicknesses produce different acting forces onto the solution in which the organic luminescent material is dissolved. Thus, the different solutions that correspond to different sub-pixel regions climb at different speeds in the corresponding sub-pixel regions. Meanwhile, the repulsive effect of the lyophobic material layer to the solutions is used so that the climbing heights of the solutions on a slope of the pixel definition layer are further controlled. Thus, the climbing quantities of the different solutions in the corresponding pixel definition layers are the same as much as possible. The film-forming uniformity of the solutions in the pixel region is effectively improved.

An orthographic projection of the surface away from the base substrate 001 of the lyophilic material layer 002 on the base substrate 001 is within an orthographic projection of the surface close to the base substrate 001 of the lyophilic material layer 002 on the base substrate 001. And/or, an orthographic projection of the surface away from the base substrate 001 of the lyophobic material layer 003 on the base substrate is within an orthographic projection of the surface close to the base substrate 001 of the lyophobic material layer 003 on the base substrate 001. And/or, an area of an orthographic projection of the surface close to the base substrate 001 of the lyophobic material layer 003 on the base substrate 001 may be less than or equal to an area of an orthographic projection of the surface away from the base substrate 001 of the lyophilic material layer 002 on the base substrate 001.

The pixel definition layer may have the same thickness in all the regions. That is, the pixel definition layer has the same thickness in different positions. In this way, the flatness of the whole pixel definition layer may be guaranteed, thereby ensuring the flatness of the organic luminescent layer disposed in the pixel region defined by the pixel definition layer, and the flatness of other film layers formed on the side, away from the base substrate 001, of the pixel definition layer, and further guaranteeing an image display effect of a display base substrate.

The lyophilic material layer 002 has a total thickness of 0.05-0.5 micrometer. The lyophobic material layer 003 has a total thickness of 0.2-2 micrometers.

In a implementation, that the lyophilic material layers 002 that define the different sub-pixel regions in the same pixel region have different thicknesses may be manifested in that the thicknesses of the lyophilic material layer 002 that define the different sub-pixel regions in the same pixel region and the areas of the sides, close to the base substrate, of the sub-pixel regions that are defined by the corresponding lyophilic material layers 002 are in positive correlation. In this way, since the relatively thicker lyophilic material layer 002 may produce a relatively greater attraction to solution molecules and the relatively thinner lyophilic material layer 002 may produce a relatively smaller attraction to the solution molecules, the solution molecules for forming the sub-pixels with relatively greater areas may climb in the sub-pixel region at a relatively higher speed, and the solution molecules for forming the sub-pixels with relatively smaller areas may climb in the sub-pixel region at a relatively lower speed. Thus, the climbing quantities of the solutions for forming the sub-pixels with different areas in the corresponding sub-pixel regions are the same as much as possible so as to improve the film-forming uniformity in the pixel region.

In another implementation, that the lyophilic material layers 002 defining the different sub-pixel regions in the same pixel region have different thicknesses may be manifested in that the sub-pixel regions in the same pixel region include a first sub-pixel region, a second sub-pixel region and a third sub-pixel region, each sub-pixel region is used to set a sub-pixel in one color, and the lyophilic material layers 002 that define the sub-pixel regions in which the sub-pixels in different colors are set have different thicknesses. In accordance with properties of materials from which the sub-pixels in different colors are made, the areas of the sides, close to the base substrate 001, of the sub-pixel regions that correspond to the sub-pixels in different colors in the pixel region are different. When the lyophilic material layers 002 that define the sub-pixel regions in which the sub-pixels in different colors are disposed have different thicknesses, since the relatively thicker lyophilic material layer 002 may produce a relatively greater attraction to solution molecules, and the relatively thinner lyophilic material layer 002 may produce a relatively smaller attraction to the solution molecules, correspondingly, when a film layer is formed in a corresponding sub-pixel region, the solution molecules that correspond to the sub-pixel region with a relatively greater area climb in the sub-pixel region at a relatively higher speed, and the solution molecules that correspond to the sub-pixel with a relatively smaller area climb in the sub-pixel region at a relatively lower speed. Thus, the climbing quantities of the solutions that correspond to the sub-pixel regions with different areas on the corresponding pixel definition layer are the same as much as possible. Then, the film-forming uniformity in the pixel region is improved.

That the lyophilic material layers 002 in the different sub-pixel regions have different thicknesses may be realized in the way that the thickness of the lyophilic material layer 002 that defines the first sub-pixel region, the thickness of the lyophilic material layer 002 that defines the second sub-pixel region, and the thickness of the lyophilic material layer 002 that defines the third sub-pixel region are sequentially increased.

Generally, the sub-pixels in each pixel region include: a red sub-pixel, a green sub-pixel and a blue sub-pixel. In accordance with properties of materials from which the red sub-pixel, the green sub-pixel and the blue sub-pixel are made, the material from which the red sub-pixel is made has the longest service life, and the material from which the blue sub-pixel is made has the shortest service life. The smaller the luminous quantity per unit area is, the smaller the current density per unit area is and the longer the service life of a luminescent material is. Thus, it is possible to control the service life of the luminescent material by controlling the current density of the luminescent material per unit area. Correspondingly, in order to make the service lives of the red sub-pixel, the green sub-pixel and the blue sub-pixel in a display panel be the same as much as possible, the areas of the red sub-pixel, the green sub-pixel and the blue sub-pixel are usually increased sequentially to prolong the service life of the blue sub-pixel and the green sub-pixel as much as possible. That is, the first sub-pixel region is sued to set the red sub-pixel, the second sub-pixel is used to set the green sub-pixel, and the third sub-pixel is used to set the blue sub-pixel. On this basis, that the lyophilic material layers 002 corresponding to the sub-pixels in different colors have different thicknesses may be realized in the way that the thickness of the lyophilic material layer 002 that corresponds to a red sub-pixel region, the thickness of the lyophilic material layer 002 that corresponds to a green sub-pixel region and the thickness of the lyophilic material layer 002 that corresponds to a blue sub-pixel region are increased sequentially.

Optionally, that the lyophilic material layers 002 in the different sub-pixel regions have different thicknesses may be realized in various ways. The embodiment of the present disclosure takes the following implementations as examples for description.

In a first implementation, the lyophilic material layer 002 may include at least two lyophilic sub-layers that are disposed at the same layer. In the same pixel region, each lyophilic sub-layer corresponds to one of the sub-pixel regions. The at least two lyophilic sub-layers have different thicknesses.

Figure 2:
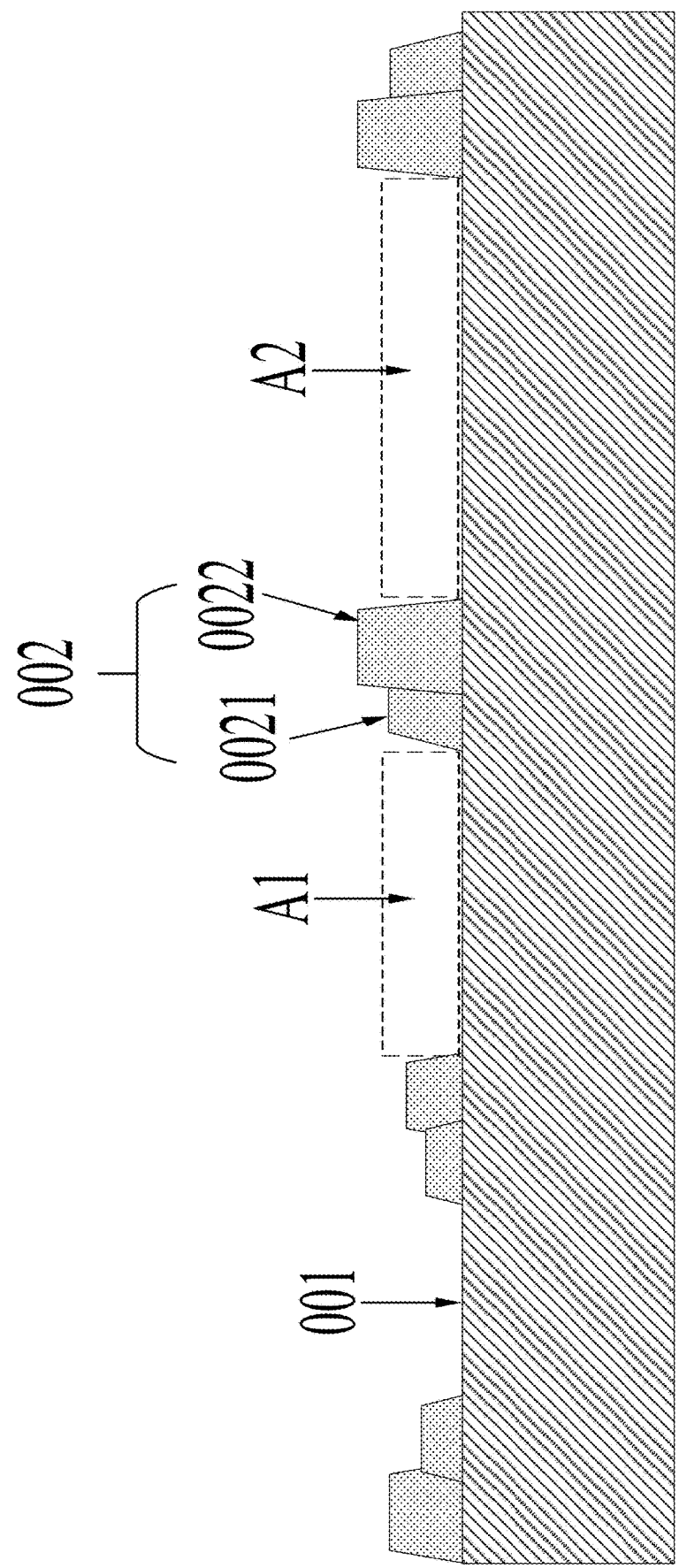
FIG. 2 is a schematic diagram of a structure of a lyophilic material layer according to an embodiment of the present disclosure.

Exemplarily, FIG. 2 is a schematic diagram of a structure that the lyophilic material layer 002 includes two lyophilic sub-layers disposed at the same layer. As shown in FIG. 2, the lyophilic material layer 002 includes a first lyophilic sub-layer 0021 and a second lyophilic sub-layer 0022 that are disposed at the same layer. The thickness of the first lyophilic sub-layer 0021 is less than that of the second lyophilic sub-layer 0022. Besides, the first lyophilic sub-layer 0021 corresponds to a first sub-pixel region A1. The second lyophilic sub-layer 0022 corresponds to a second sub-pixel region A2. The area of the side close to the base substrate 001 of the first sub-pixel region A1 is smaller than that of the side close to the base substrate 001 of the second sub-pixel region A2.

In a second implementation, the lyophilic material layer 002 may include at least two lyophilic sub-layers and is formed by superimposing the at least two lyophilic sub-layers. For the different sub-pixel regions in the same pixel region, the lyophilic material layers 002 include different layer numbers of lyophilic sub-layers.

Figure 3:
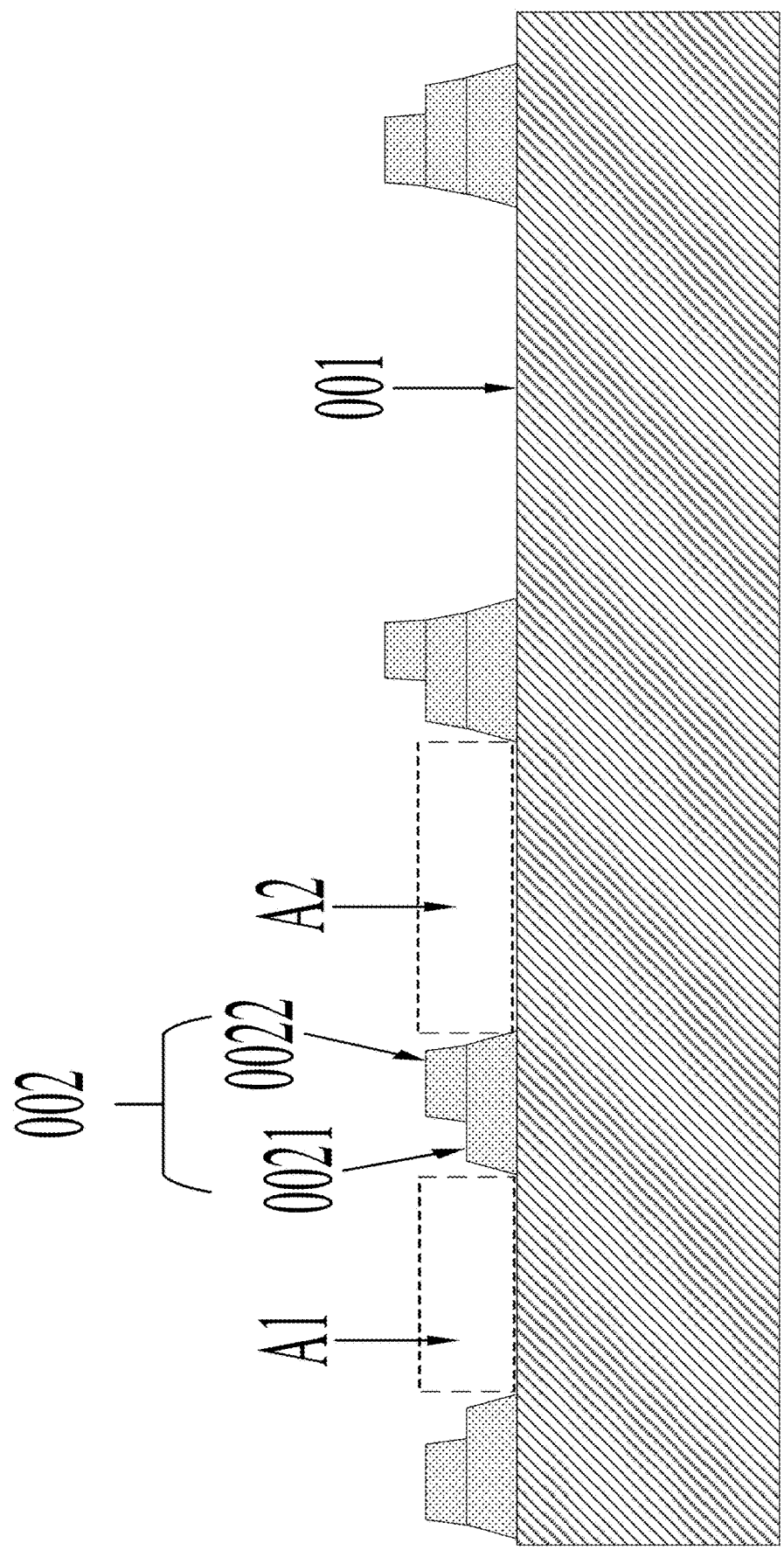
FIG. 3 is a schematic diagram of a structure of another lyophilic material layer according to an embodiment of the present disclosure.

Exemplarily, FIG. 3 is a schematic diagram of a structure that the lyophilic material layer 002 includes at least two superimposed lyophilic sub-layers. Referring to FIG. 3, the lyophilic material layer 002 include at least a first lyophilic sub-layer 0021 and a second lyophilic sub-layer 0022. The thickness of the first lyophilic sub-layer 0021 is equal to that of the second lyophilic sub-layer 0022. The lyophilic material layer 002 that corresponds to the first sub-pixel region A1 includes the first lyophilic sub-layer 0021. The lyophilic material layer 002 that corresponds to the second sub-pixel region A2 includes the first lyophilic sub-layer 0021 and the second lyophilic sub-layer 0022. The area of the side close to the base substrate 001 of the first sub-pixel region A1 is smaller than an area of the side close to the base substrate 001 of the second sub-pixel region A2.

Figure 4:
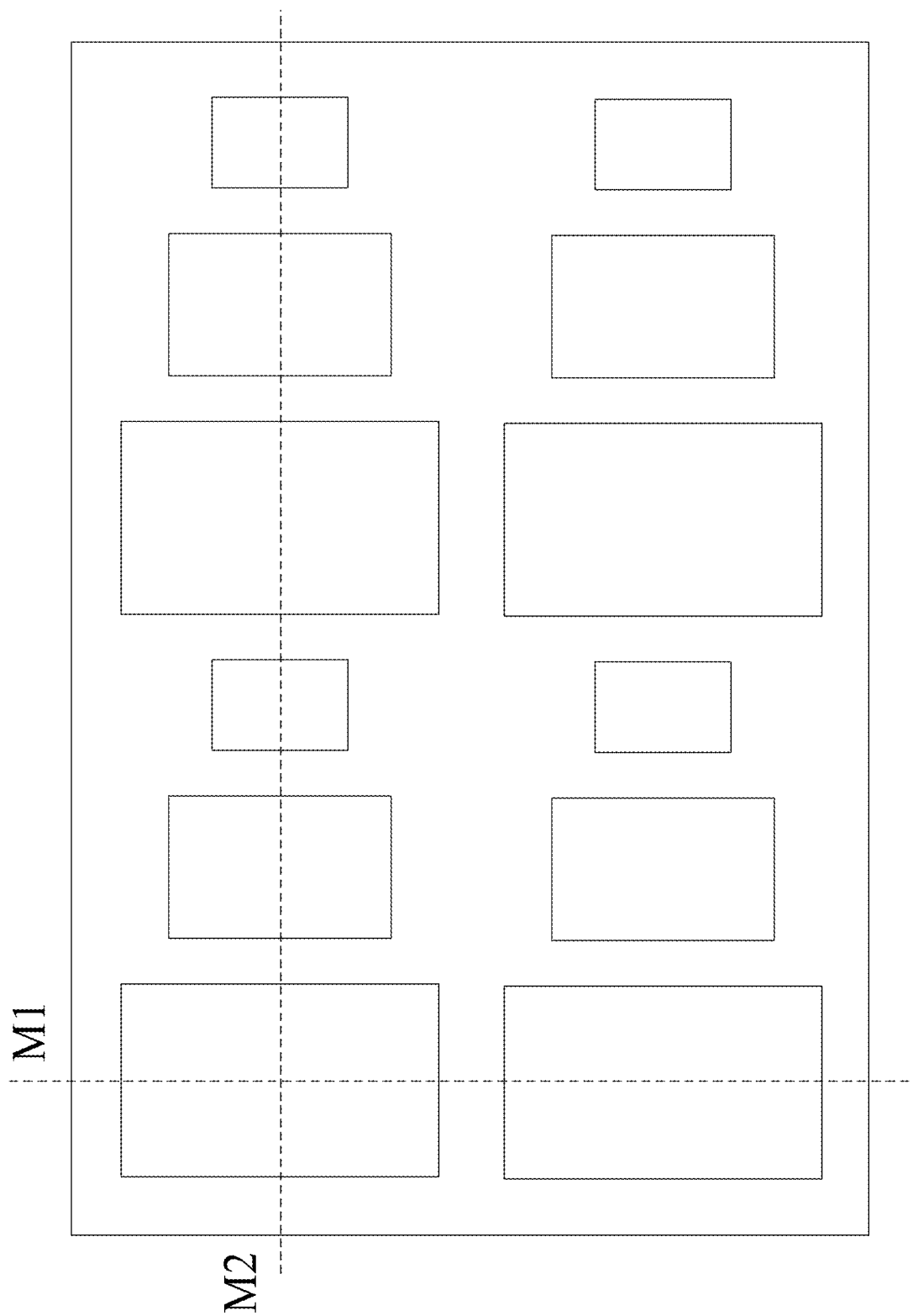
FIG. 4 is a schematic diagram of directions of two cross sections of an edge of a sub-pixel region on a lyophilic material layer according to an embodiment of the present disclosure.

In the second implementation, corresponding to each sub-pixel region, a cross section of the sub-pixel region in a direction that is parallel to the base substrate 001 may be rectangular. Two cross sections, corresponding to an edge of a sub-pixel region, of each lyophilic sub-layer, are trapezoidal. That is, the cross sections of the lyophilic sub-layers in each sub-pixel region in a target direction are trapezoidal. The target direction is perpendicular to the base substrate 001 and parallel to the edge of the sub-pixel region. For example, the cross section of each lyophilic sub-layer may be shaped like an erected trapezoid or an inverted trapezoid. FIG. 3 is a schematic view of each lyophilic sub-layer of which the cross section is shaped like the erected trapezoid. FIG. 4 is a schematic top view of the lyophilic material layer on the base substrate. As shown in FIG. 4, these two cross sections (dotted lines M1 and M2 in FIG. 4 are directions of the two cross sections respectively) are perpendicular to the surface of the side close to the base substrate 001 of the lyophilic material layer 002 and are respectively parallel to an arrangement row direction and an arrangement column direction of the sub-pixel regions. When the two cross sections, corresponding to the edge of one sub-pixel region, of each lyophilic sub-layer are trapezoidal, operating distances between portions, with different thicknesses, of the lyophilic material layer 002 and a solution are gradually shortened in a direction away from the base substrate 001, such that the attraction function of the portions, with different thicknesses, of the lyophilic material layer 002 to the solution molecules is gradually reduced. As the lyophobic material layer 003 is disposed on the surface, away from the base substrate 001, of the lyophilic material layer 002, and may play a repulsive effect on the solution molecules, under the combined action of the lyophobic material layer 003 and the lyophilic material layer 002 of which the attraction function is reduced, in the direction away from the base substrate 001, not only may the solution molecules be spread in the sub-pixel region evenly, but also the climbing height of the solution molecules on the pixel definition layer may be controlled.

To sum up, the pixel definition layer provided by the embodiment of the present disclosure includes the lyophilic material layer and the lyophobic material layer. The lyophilic material layers that define the different sub-pixel regions in the same pixel region have different thicknesses, such that in a process of manufacturing an organic luminescent layer, the lyophilic material layers with different thicknesses produce different acting forces to the solution in which the organic luminescent material is dissolved. Thus, the different solutions that correspond to different sub-pixel regions climb at different speeds in the corresponding sub-pixel regions. Meanwhile, by using the repulsive effect of the lyophobic material layer to the solutions, the climbing heights of the solutions on a slope of the pixel definition layer are further controlled. Thus, the climbing quantities of the different solutions in the corresponding pixel definition layers are the same as much as possible. The film-forming uniformity of the solutions in the pixel region is effectively improved. Further, the brightness uniformity of a display device is improved.

Figure 5:
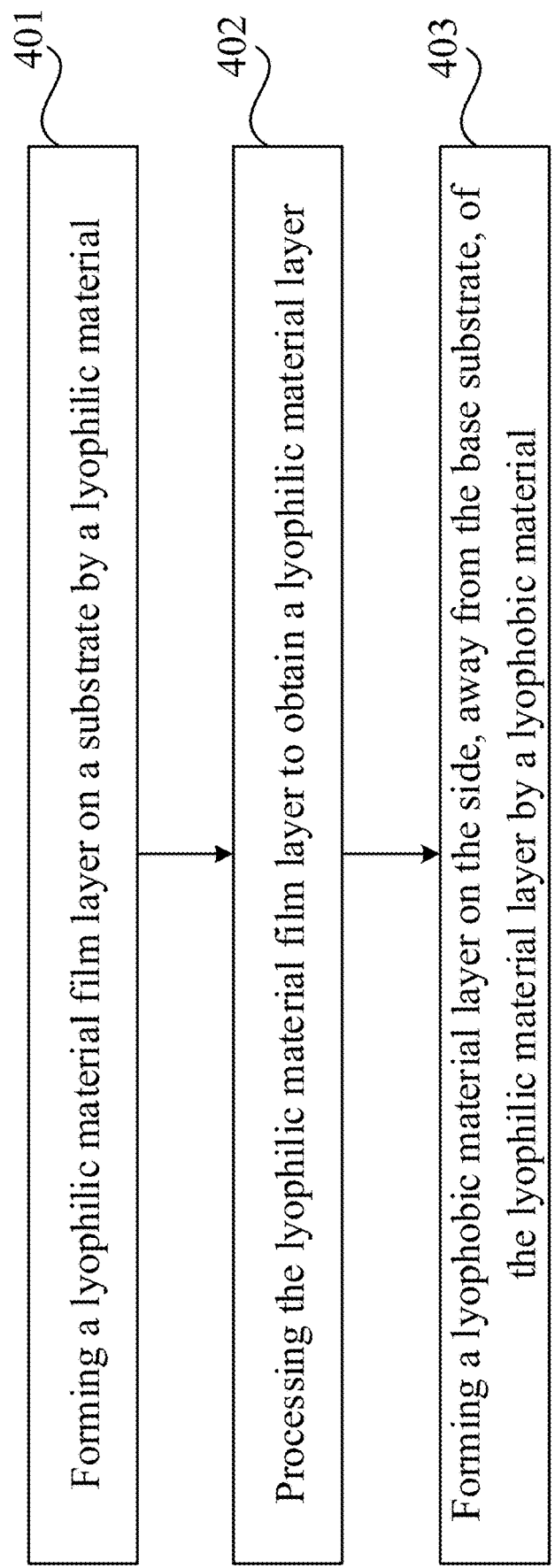
FIG. 5 is a flowchart of a method for manufacturing a pixel definition layer according to an embodiment of the present disclosure.

FIG. 5 is a flow chart of a manufacturing method of a pixel definition layer, provided by an embodiment of the present disclosure. As shown in FIG. 5, the manufacturing method may include the following operating processes.

In step 401, a lyophilic material film layer is formed on a base substrate by a lyophilic material.

Figure 6:
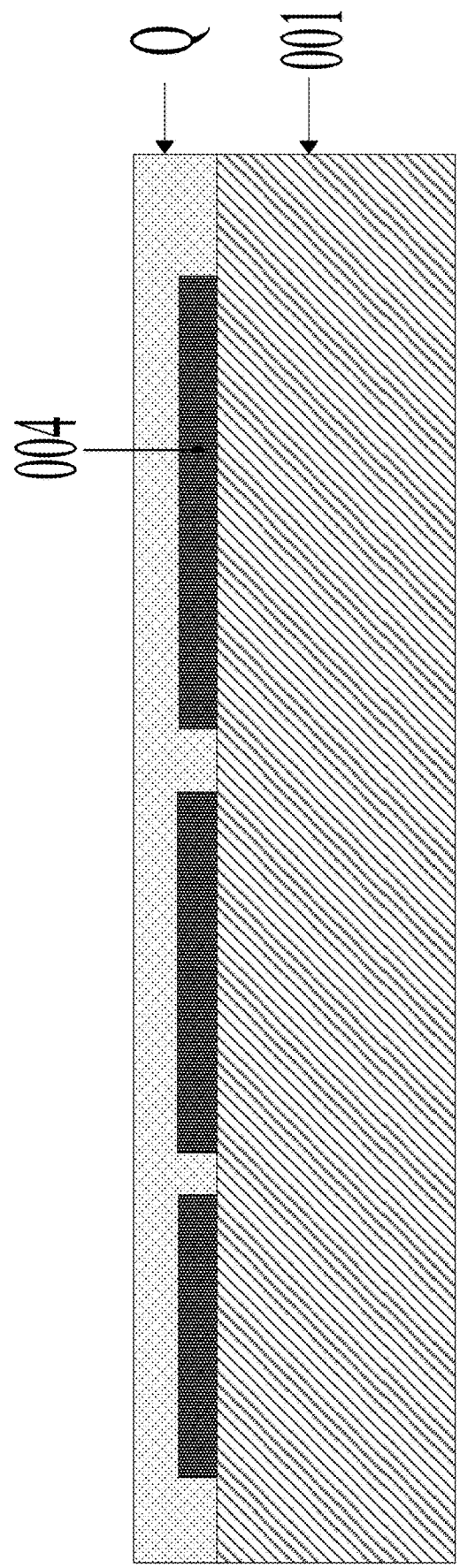
FIG. 6 is a schematic diagram of a structure of a base substrate with an anode formed thereon, on which a lyophilic material film layer is formed, according to an embodiment of the present disclosure.

Magnetron sputtering, thermal evaporation, plasma enhanced chemical vapor deposition (PECVD) or the like may be adopted to deposit a layer of the lyophilic material with a certain thickness on the base substrate. The lyophilic material is a material that is appealing to a solution in which an organic electroluminescent material is dissolved, such as silicon dioxide and silicon nitride. The thickness of the first film layer may be set in accordance with actual demands. Exemplarily, FIG. 6 is a schematic diagram of a structure that the lyophilic material film layer Q is formed on the substrate 001 with an anode 004 formed thereon according to an embodiment of the present disclosure.

In step 402, the lyophilic material film layer is processed to obtain a lyophilic material layer.

Optionally, the step 402 may include: forming a photoresist layer on the base substrate with the lyophilic material film layer formed thereon, then, adopting a preset mask to perform exposure on the lyophilic material film layer with the photoresist layer formed on a surface, and after that, performing developing, etching and stripping on the photoresist layer subjected to exposure to obtain the lyophilic material layer.

The preset mask may be a halftone mask. Light transmitting degrees of different light transmitting regions in the halftone mask may be set in accordance with the shape of the lyophilic material layer which needs to be formed, such that the lyophilic material layers define a plurality of pixel regions, in an arrangement of array, on the base substrate. Each pixel region includes at least two sub-pixel regions. The lyophilic material layers that define the different sub-pixel regions in the same pixel region have different thicknesses.

Figure 7:
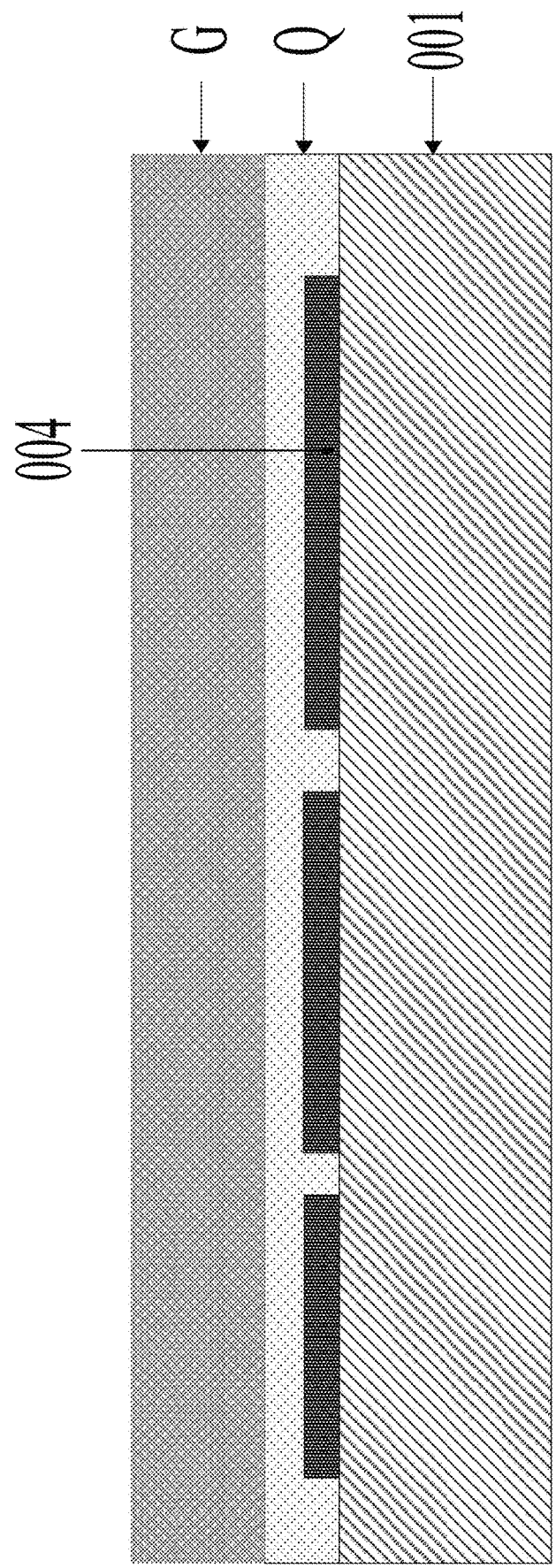
FIG. 7 is a schematic diagram of a structure of a base substrate with a lyophilic material film layer formed thereon, on which a photoresist layer is formed, according to the embodiment of the present disclosure.
Figure 8:
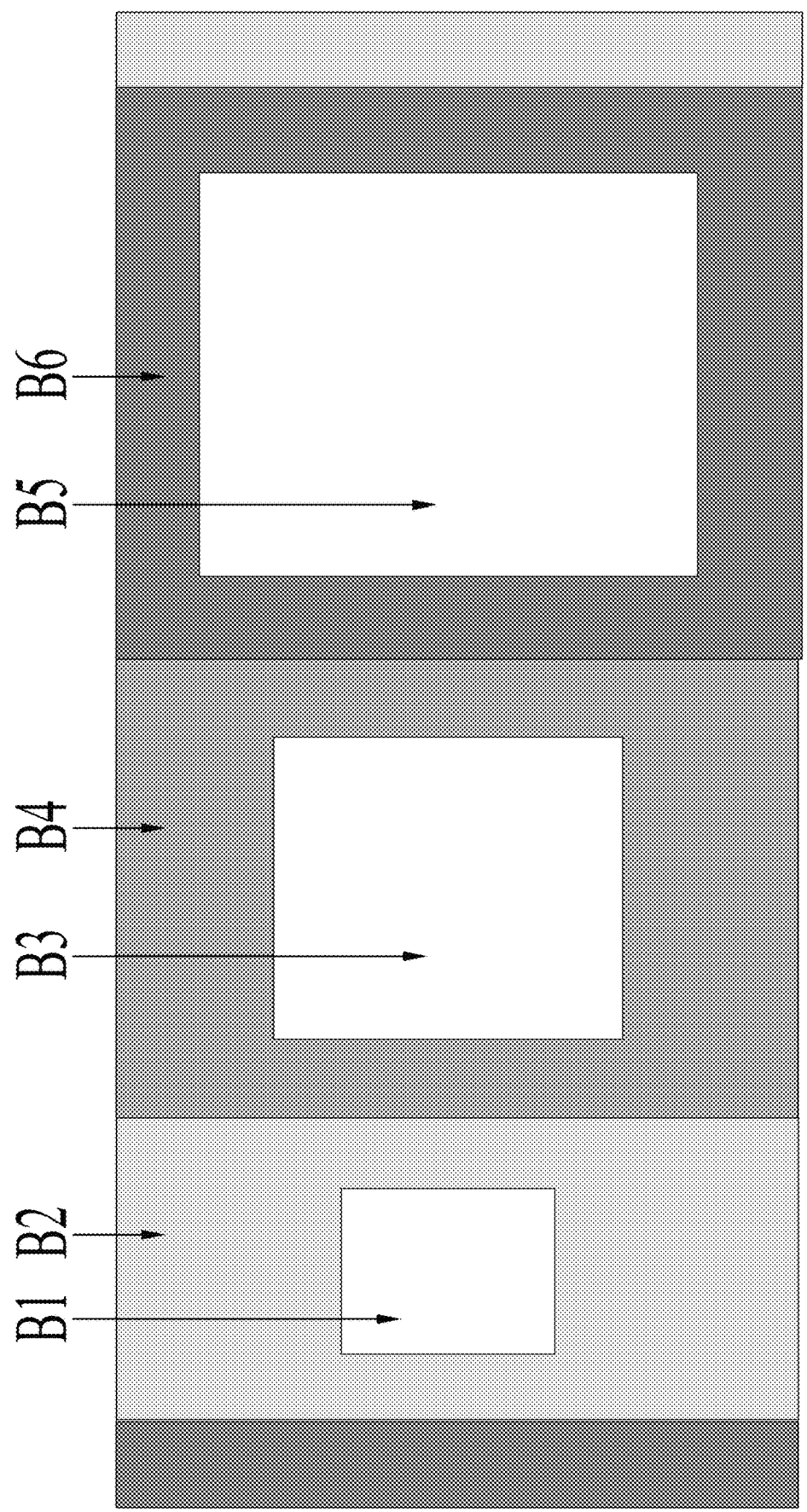
FIG. 8 is a schematic diagram of a halftone mask according to an embodiment of the present disclosure.
Figure 9:
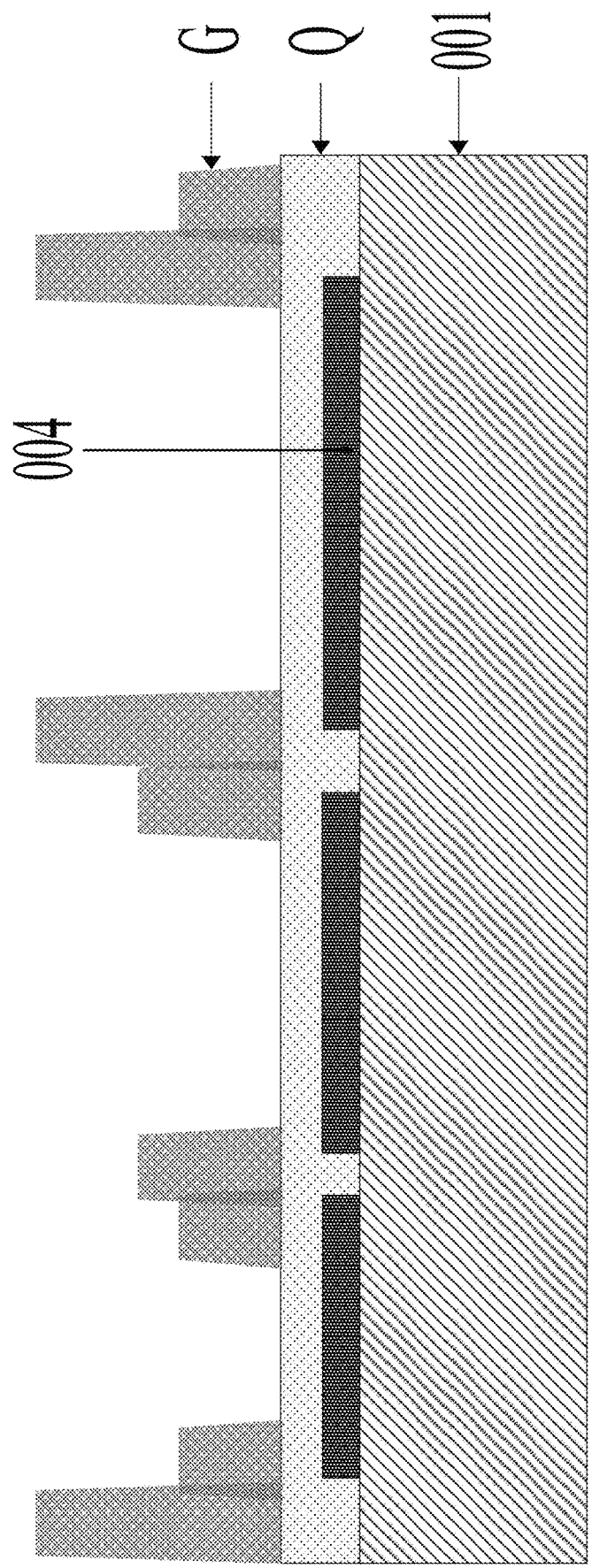
FIG. 9 is a schematic view of a photoresist layer on a base substrate after exposure and developing are performed on a lyophilic material film layer by means of the halftone mask illustrated in FIG. 8 according to the embodiment of the present disclosure.
Figure 10:
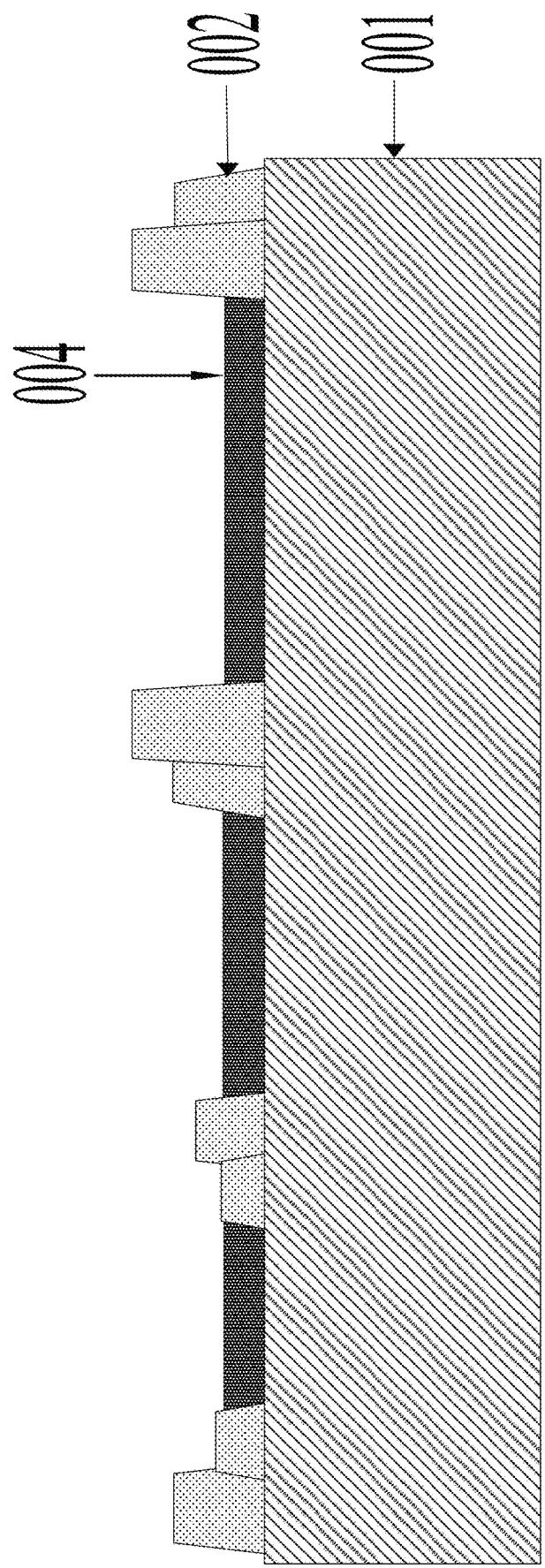
FIG. 10 is a schematic diagram of a structure of a lyophilic material layer obtained by processing a lyophilic material film layer according to the embodiment of the present disclosure.

Exemplarily, FIG. 7 is a schematic diagram of a structure that the photoresist layer is formed on the base substrate with the lyophilic material film layer formed thereon according to the embodiment of the present disclosure. FIG. 8 is a schematic view of the halftone mask provided by the embodiment of the present disclosure. FIG. 9 is a schematic view of the photoresist layer on the base substrate after exposure and developing are performed on the lyophilic material film layer by means of the halftone mask illustrated in FIG. 8 according to the embodiment of the present disclosure. FIG. 10 is a schematic diagram of a structure of the lyophilic material layer obtained by processing the lyophilic material film layer according to the embodiment of the present disclosure. In FIG. 7, when the photoresist layer G formed on the base substrate 001 with the lyophilic material film layer Q formed thereon is a positive photoresist and each pixel region includes a first sub-pixel region, a second sub-pixel region and a third sub-pixel region, the halftone mask that corresponds to each pixel region may include six light transmitting regions illustrated in FIG. 8 (the different gray scales in FIG. 8 represent different light transmitting degrees, and the lighter the gray scale is, the higher the light transmitting degree is). These six light transmitting regions are respectively a light transmitting region B1, a light transmitting region B2, a light transmitting region B3, a light transmitting region B4, a light transmitting region B5 and a light transmitting region B6. The light transmitting region B1 and the light transmitting region B2 correspond to the first sub-pixel region. The light transmitting region B3 and the light transmitting region B4 correspond to the second sub-pixel region. The light transmitting region B5 and the light transmitting region B6 correspond to the third sub-pixel region. The light transmitting region B1, the light transmitting region B3 and the light transmitting region B5 are all open regions. The light transmitting degrees of the light transmitting region B2, the light transmitting region B4 and the light transmitting region B6 are sequentially increased. After exposure and developing the lyophilic material film layer Q by using the halftone mask, referring to FIG. 9 for the schematic view of the photoresist layer G on the base substrate 001. After etching (for example, dry etching) and stripping are performed on the photoresist layer G, referring to FIG. 10 for the schematic diagram of a structure of the obtained lyophilic material layer 002.

In step 403, a lyophobic material layer is formed on the side, away from the base substrate, of the lyophilic material layer by a lyophobic material.

Optionally, the side, away from the base substrate, of the lyophilic material layer may be coated with the lyophobic material having a certain thickness to obtain a lyophobic material film layer. When the lyophobic material layer includes a pattern, pattern processing may be performed on the lyophobic material film layer to obtain the lyophobic material layer with the pattern. The lyophobic material may be a material that is repellent to the solution in which the electroluminescent material is dissolved, such as fluorinated polyimide, fluorinated polymethyl methacrylate and polysiloxane. Exemplarily, referring to FIG. 1 for the schematic diagram of a structure after the lyophobic material layer 003 is formed on the side, away from the base substrate 001, of the lyophilic material layer 002.

It should be noted that since the lyophobic material may be such photoresist materials as fluorinated polyimide, fluorinated polymethyl methacrylate and polysiloxane, during pattern processing of the lyophobic material film layer, exposure may be performed on the lyophobic material film layer from the side, away from the base substrate, of the lyophobic material film layer. Then, developing is performed on the lyophobic material film layer subjected to exposure. After that, baking is performed on the lyophobic material film layer subjected to developing to obtain the lyophobic material layer.

An orthographic projection of the surface away from the base substrate 001 of the lyophilic material layer on the base substrate is within an orthographic projection of the surface close to the base substrate of the lyophilic material layer on the base substrate. And/or, an orthographic projection of the surface away from the base substrate of the lyophobic material layer on the base substrate is within an orthographic projection of the surface close to the base substrate of the lyophobic material layer on the base substrate. Alternatively, an area of an orthographic projection of the surface close to the base substrate of the lyophobic material layer on the base substrate may be smaller than or equal to an area of an orthographic projection of the surface away from the base substrate of the lyophilic material layer 002 on the base substrate.

To sum up, the pixel definition layer manufactured with the manufacturing method for a pixel definition layer according to the embodiment of the present disclosure includes the lyophilic material layer and the lyophobic material layer. The lyophilic material layers that define the different sub-pixel regions in the same pixel region have different thicknesses, such that in a process of manufacturing an organic luminescent layer, the lyophilic material layers with different thicknesses produce different acting forces onto the solution in which the organic luminescent material is dissolved. Thus, the different solutions that correspond to different sub-pixel regions climb at different speeds in the corresponding sub-pixel regions. Meanwhile, by using the repulsive effect of the lyophobic material layer to the solutions, the climbing heights of the solutions on a slope of the pixel definition layer are further controlled. Thus, the climbing quantities of the different solutions in the corresponding pixel definition layers are the same as much as possible. The film-forming uniformity of the solutions in the pixel region is effectively improved. Further, the brightness uniformity of a display device is improved.

An embodiment of the present disclosure further provides a display substrate. The display substrate may include: a base substrate, a pixel definition layer on the base substrate, and a luminescent layer in a pixel region that is defined by the pixel definition layer. The pixel definition layer may be the one shown in FIG. 1.

Optionally, the display substrate may at least include: an anode disposed between the base substrate and the pixel definition layer, and a cathode disposed on the side away from the base substrate of the luminescent layer.

Figure 11:
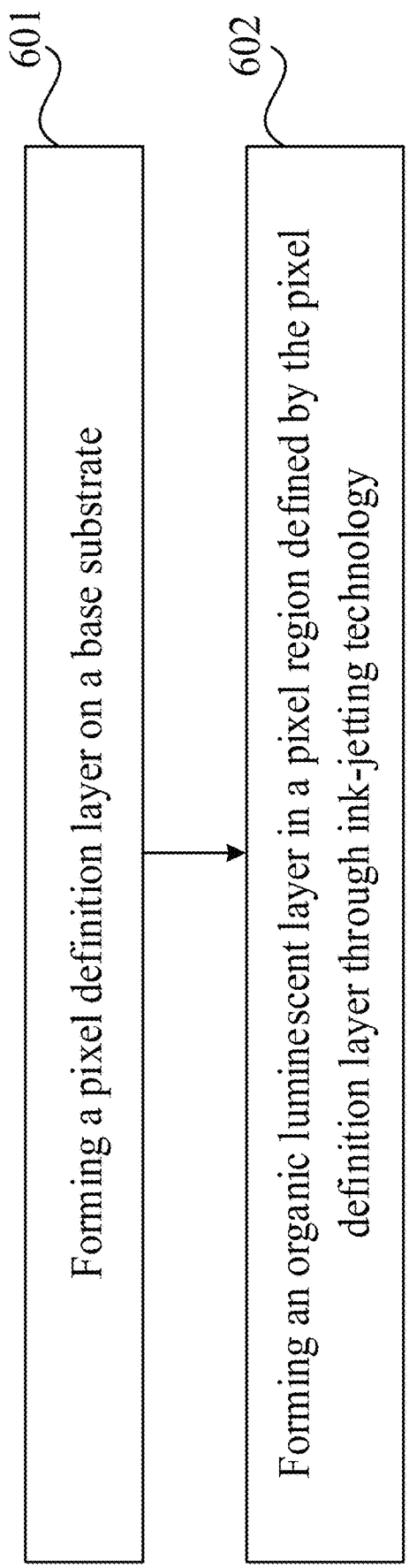
FIG. 11 is a flowchart of a method for manufacturing a display substrate according to an embodiment of the present disclosure.

An embodiment of the present disclosure further provides a manufacturing method of a display substrate. As shown in FIG. 11, the manufacturing method may include the following steps.

In step 601, a pixel definition layer is formed on a base substrate.

Optionally, the pixel definition layer may be formed on the base substrate by the manufacturing method of the pixel definition layer, illustrated in FIG. 5, which will not be repeated herein.

In step 602, an organic luminescent layer is formed in a pixel region defined by the pixel definition layer.

Specifically, a solution in which an organic electroluminescent material is dissolved may be sprayed into the pixel region, and then baked to obtain the organic luminescent layer made of the organic electroluminescent material.

It should be noted that the pixel definition layer provided by the present disclosure may also be applied to an inorganic electroluminescent material (for example, a quantum dot luminescent material), a photoluminescent material or other auxiliary luminescent materials, etc., which will not be limited herein.

An embodiment of the present disclosure further provides a display panel which may include the display substrate in the above embodiments. The display panel may be any product or part with a display function, such as a liquid crystal panel, an electronic paper, a tablet computer, a TV, a display, a laptop computer, a digital photo frame, a navigator, etc. Exemplarily, the display panel may be an OLED or a QLED display panel.

An embodiment of the present disclosure further provides a display device including the display panel in the above embodiment.

It should be noted that the term "and/or" herein describes the correspondence of the corresponding objects, indicating three kinds of relationship. For example, A and/or B, can be expressed as: A exists alone, A and B exist concurrently, B exists alone. The character "/" generally indicates that the context object is an "or" relationship.

The foregoing descriptions are only exemplary embodiments of the present disclosure, and are not intended to limit the present disclosure. Within the spirit and principles of the disclosure, any modifications, equivalent substitutions, improvements, etc., are falling into the protection scope of the appended claims of the present disclosure.

What is claimed is:

1. A pixel definition layer, comprising:
a lyophilic material layer on a base substrate, and
a lyophobic material layer on a side, away from the base substrate, of the lyophilic material layer,
wherein the pixel definition layer defines a plurality of pixel regions, in an arrangement of array, on the base substrate, each pixel region comprises at least two sub-pixel regions, and
wherein for the lyophilic material layer and lyophobic material layer located between two adjacent sub-pixel regions, the lyophilic material layer comprises at least two lyophilic sub-layers which are in a stepped construction and are configured to cause the lyophilic material layer to have different thicknesses when defining different sub-pixel regions in a same pixel region.

2. The pixel definition layer according to claim 1, wherein the thicknesses of the lyophilic material layers when defining the different sub-pixel regions in the same pixel region are positively correlated with areas of the sides, close to the base substrate, of the sub-pixel regions that are defined by the corresponding lyophilic material layers.

3. The pixel definition layer according to claim 1, wherein the sub-pixel regions in the same pixel region comprise a first sub-pixel region, a second sub-pixel region and a third sub-pixel region, each sub-pixel region has sub-pixels in one color, and the lyophilic material layers has different thicknesses when defining the sub-pixel regions having the sub-pixels in different colors.

4. The pixel definition layer according to claim 3, wherein the thickness of the lyophilic material layer that defines the first sub-pixel region, the thickness of the lyophilic material layer that defines the second sub-pixel region, and the thickness of the lyophilic material layer that defines the third sub-pixel region are increased sequentially.

5. The pixel definition layer according to claim 4, wherein the first sub-pixel region is adapted to a red sub-pixel, the second sub-pixel is adapted to a green sub-pixel, and the third sub-pixel is adapted to a blue sub-pixel.

6. The pixel definition layer according to claim 1, wherein for the lyophilic material layer located between two adjacent sub-pixel regions, the lyophilic material layer comprises two lyophilic sub-layers with different thicknesses at the same layer, and each sub-pixel region corresponds to one lyophilic sub-layer having a different thickness from other sub-pixel regions in a same pixel region.

7. The pixel definition layer according to claim 1, at least two lyophilic sub-layers of the lyophilic material layer located between two adjacent sub-pixel regions are in a superimposed structure, and the layer numbers of the lyophilic sub-layers contained in the lyophilic material layer are different when defining the different sub-pixel regions in the same pixel region.

8. The pixel definition layer according to claim 1, wherein an orthographic projection of the surface, away from the base substrate, of the lyophilic material layer on the base substrate is within an orthographic projection of the surface, close to the base substrate, of the lyophilic material layer on the base substrate.

9. The pixel definition layer according to claim 1, wherein an orthographic projection of the surface, away from the base substrate, of the lyophobic material layer on the base substrate is within an orthographic projection of the surface, close to the base substrate, of the lyophobic material layer on the base substrate.

10. The pixel definition layer according to claim 1, wherein an area of an orthographic projection of the surface, close to the base substrate, of the lyophobic material layer on the base substrate is equal to an area of an orthographic projection of the surface, away from the base substrate, of the lyophilic material layer on the base substrate.

11. The pixel definition layer according to claim 1, wherein for the lyophilic sub-layers in each sub-pixel region, cross sections of the lyophilic sub-layers in a target direction are trapezoidal, and the target direction is perpendicular to the base substrate and parallel to an edge of the sub-pixel region.

12. The pixel definition layer according to claim 1, wherein a cross section of the sub-pixel region in a direction parallel to the base substrate is rectangular.

13. The pixel definition layer according to claim 1, wherein it has a same thickness in different positions.

14. The pixel definition layer according to claim 1, wherein the lyophilic material layer has a total thickness of 0.05-0.5 micrometer, and the lyophobic material layer has a total thickness of 0.2-2 micrometers.

15. The pixel definition layer according to claim 1, wherein
the lyophilic material layer is made from a lyophilic material that contains one of silicon dioxide and silicon nitride; and
the lyophobic material layer is made from a lyophobic material that contains one of fluorinated polyimide, fluorinated polymethyl methacrylate and polysiloxane.

16. A method of manufacturing a pixel definition layer, comprising:
forming a lyophilic material film layer on a base substrate by a lyophilic material;
processing the lyophilic material film layer to obtain a lyophilic material layer; and
forming a lyophobic material layer on a side, away from the base substrate, of the lyophilic material layer by a lyophobic material, wherein the lyophilic material layer defines a plurality of pixel regions, in an arrangement of array, on the base substrate, each pixel region comprises at least two sub-pixel regions, and
wherein for the lyophilic material layer and lyophobic material layer located between two adjacent sub-pixel regions, the lyophilic material layer comprises at least two lyophilic sub-layers which are in a stepped construction and are configured to cause the lyophilic material layer to have different thicknesses when defining different sub- pixel regions in a same pixel region.

17. The method according to claim 16, wherein said processing the lyophilic material film layer to obtain the lyophilic material layer comprises:
performing pattern processing on the lyophilic material film layer by means of a predetermined mask.

18. A display substrate, comprising a base substrate, a pixel definition layer on the base substrate, and a luminescent layer in a pixel region defined by the pixel definition layer, wherein the pixel definition layer comprises:
a lyophilic material layer on the base substrate and a lyophobic material layer on a side, away from the base substrate, of the lyophilic material layer,
wherein the pixel definition layer defines a plurality of pixel regions, in an arrangement of array, on the base substrate, each pixel region comprises at least two sub-pixel regions, and
wherein for the lyophilic material layer and lyophobic material layer located between two adjacent sub-pixel regions, the lyophilic material layer comprises at least two lyophilic sub-layers which are in a stepped construction and are configured to cause the lyophilic material layer to have different thicknesses when defining different sub-pixel regions in a same pixel region.

19. The display substrate according to claim 18, further comprising:
an anode between the base substrate and the pixel definition layer, and a cathode on the side, away from the base substrate, of the luminescent layer.

20. A display device, comprising the display substrate according to claim 18.

* * * * *